United States Patent
Fu et al.

(10) Patent No.: US 9,086,626 B2
(45) Date of Patent: Jul. 21, 2015

(54) PHOTO-PATTERNABLE AND DEVELOPABLE SILSESQUIOXANE RESINS FOR USE IN DEVICE FABRICATION

(75) Inventors: Peng-Fei Fu, Midland, MI (US); Eric S. Moyer, Midland, MI (US); Jason Suhr, Coleman, MI (US)

(73) Assignee: DOW CORNING CORPORATION, Midland, MI (US)

( * ) Notice: Subject to any disclaimer, the term of this patent is extended or adjusted under 35 U.S.C. 154(b) by 0 days.

(21) Appl. No.: 14/007,671

(22) PCT Filed: Mar. 28, 2012

(86) PCT No.: PCT/US2012/030787
§ 371 (c)(1),
(2), (4) Date: Sep. 26, 2013

(87) PCT Pub. No.: WO2012/154316
PCT Pub. Date: Nov. 15, 2012

(65) Prior Publication Data
US 2014/0023970 A1 Jan. 23, 2014

Related U.S. Application Data

(60) Provisional application No. 61/468,652, filed on Mar. 29, 2011.

(51) Int. Cl.
G03F 7/075 (2006.01)

(52) U.S. Cl.
CPC .................................. *G03F 7/0757* (2013.01)

(58) Field of Classification Search
None
See application file for complete search history.

(56) References Cited

U.S. PATENT DOCUMENTS

| | | | |
|---|---|---|---|
| 6,291,540 B1 * | 9/2001 | Priou et al. | 522/31 |
| 6,409,316 B1 * | 6/2002 | Clark et al. | 347/63 |
| 8,728,335 B2 * | 5/2014 | Fu et al. | 216/41 |
| 2003/0105264 A1 * | 6/2003 | Bedwell et al. | 528/31 |
| 2009/0142694 A1 * | 6/2009 | Karkkainen et al. | 430/270.1 |

FOREIGN PATENT DOCUMENTS

| | | | |
|---|---|---|---|
| EP | 2116900 A1 | * | 11/2009 |
| JP | 2006-117846 A | * | 5/2006 |
| JP | 2009-265595 A | * | 11/2009 |
| WO | WO-2009/068754 A1 | * | 6/2009 |
| WO | WO-2009/091440 A1 | * | 7/2009 |
| WO | WO 2011/011140 A2 | * | 1/2011 |

OTHER PUBLICATIONS

English translation of JP ,2009-265595, A (2009) from machine translation from AIPN Japan Patent Office National Center for Industrial Property Information and Training, generated Apr. 16, 2014, 35 pages.*
English translation of JP ,2006-117846, A (2006) from machine translation from AIPN Japan Patent Office National Center for Industrial Property Information and Training, generated Apr. 18, 2014, 13 pages.*

* cited by examiner

*Primary Examiner* — Cynthia Hamilton
(74) *Attorney, Agent, or Firm* — Dow Corning Corporation

(57) ABSTRACT

A coatable resin solution capable of forming a coating when applied to the surface of a substrate that is photo-patternable and developable as a dielectric material upon exposure to ultraviolet radiation is provided. The resin solution comprises a silsesquioxane-based (SSQ-based) resin, at least one initiator, and an organic solvent. The SSQ-based resin includes both a hydride component and at least one photo-curable component. The resulting coating exhibits a dielectric constant that is less than or equal to about 3.5.

9 Claims, 1 Drawing Sheet

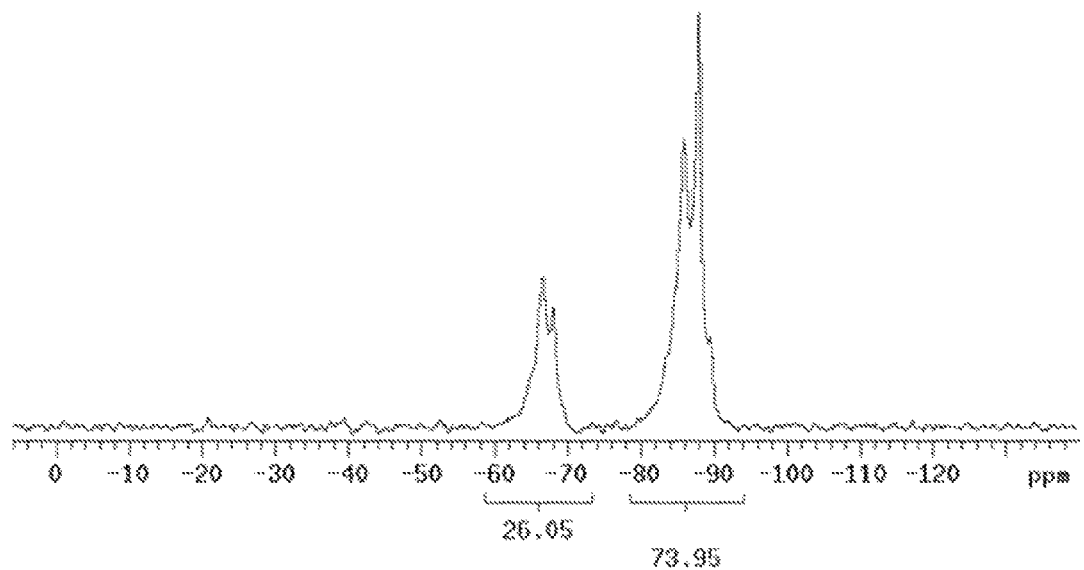

PHOTO-PATTERNABLE AND DEVELOPABLE SILSESQUIOXANE RESINS FOR USE IN DEVICE FABRICATION

CROSS REFERENCE TO RELATED APPLICATIONS

This application is the National Stage of International Application Serial No. PCT/US2012/030787 filed Mar. 28, 2012, designating the United States and published in English, which claims the benefit of the filing date under 35 U.S.C. §119(e) of U.S. Provisional Application No. 61/468,652 filed Mar. 29, 2011.

FIELD

This disclosure relates generally to silsesquioxane-based coatings and their use in electronic devices. More specifically, this disclosure relates to the preparation and use of silsesquioxane-based resins having a photo-curable component.

BACKGROUND

The selective removal of a portion of a thin film during the microfabrication of an electronic device is routinely performed in a photolithographic process. Typically, the resins present in these thin films exhibit photo-patternable qualities. Thin films may also be applied to the surface of an electronic device that can be developed as a dielectric material for protective purposes. Although the thin films in these two applications are applied to the same or similar surfaces, their properties and purpose are substantially different.

An example of a photo-curable resin composition is disclosed in Japanese Kokai No. H04-170547 in which the resin composition is used as a protective layer on color filters. The resin composition consists of a photo-polymerization compound having an unsaturated double bond and a carboxyl group, a photo-polymerization starting agent, an epoxy containing compound, and a (meth)acrylate compound including a silicon atom in a predetermined position. A paint film comprising the resin composition exhibits adhesiveness, photosensitivity to UV exposure, and excellent flatness.

Japanese Kokai No. H09-235358 also describes a photo-curable epoxy resin composition that is capable of being cured over a short-time period. The epoxy resin composition comprises an epoxy resin that has two or more 1,2-epoxy groups, a rubbery elastic resin liquid, an inorganic filler, and a group VIb element onium salt. The onium salt is capable of receiving UV light to release a Lewis acid onium salt.

Japanese Kokai No. H08-160623 discloses a positive-type resist material that is sensitive to high energy beams and far ultraviolet rays. This resist material is capable of forming a fine pattern with a high aspect ratio that is resistant to oxygen plasma etching. The resist material is developed in an alkali aqueous solution containing an acid generating agent and a silicone polymer having both a —$CH_2CH_2COOH$ moiety and a —$CH_2CH_2COOR$ moiety, where R is a t-butyl group, a t-butoxy carbonyl methyl group, a trimethyl silyl group, or a tetrahydropyranyl group.

The ability of resin to be both photo-definable and developable as a dielectric material would be desirable. The properties exhibited by such a resin, for example, low dielectric constant, high light transmittance, and excellent thermal stability, would be beneficial when the resin is used in a variety of applications.

SUMMARY

In overcoming the enumerated drawbacks and other limitations of the related art, the present disclosure generally provides a coatable resin solution capable of forming a coating when applied to the surface of a substrate that is photo-patternable and developable as a dielectric material upon exposure to ultraviolet radiation and an elevated temperature. The resin solution comprises a silsequioxane-based (SSQ-based) resin, at least one initiator, and an organic solvent. The SSQ-based resin includes both a hydride component and at least one photo-curable component. The hydride component is defined by units of —($HSiO_{3/2}$)—, which also can be simplified and written as T(H); while the photo-curable component is defined by units of —($R^1SiO_{3/2}$)—, which also can be simplified and written as $T(R^1)$, where $R^1$ is an organic photo-curable group. The initiator is selected from the group of a free-radical initiator, a cationic initiator, and a combination or mixture thereof. The organic solvent may be iso-butanol (i-BuOH), propylene glycol 1-monobutyl ether (PGBE), or propylene glycol methyl ethyl acetate (PGMEA).

According to one aspect of the present disclosure, $R^1$ of the photo-curable component —($R^1SiO_{3/2}$)— is an epoxy group, an acrylate group, an acryloxy group, a vinylether group, a vinyl group, or a mixture or combination thereof. In particular, the photo-curable component is T(CHEp), where CHEp is an epoxycyclohexylethyl group, shown below; T(Ep), where Ep is a glycidoxypropyl group, shown below; or T(MA), where MA is a methacryloxypropyl group, shown below.

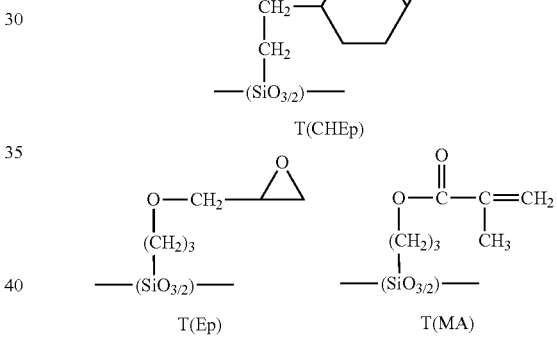

According to another aspect of the present disclosure, the SSQ-based resin further comprises an organo-siloxane component defined by units of —($R^2SiO_{3/2}$)—, which also can be simplified and written as $T(R^2)$, where $R^2$ is an organic group. The organic group may be a polyethylene glycol group, a sulfonate group, a phosphate group, a methyl group, a phenyl group, and a mixture or combination thereof. Alternatively, the SSQ-based resin may further comprise one or more organo-siloxane components in addition to $T(R^2)$, which would be denoted as $T(R^3)$, $T(R^4)$, ..., and $T(R'')$, where $R^3$, $R^4$, ..., and $R''$ are independently selected as an organic group that may be a polyethylene glycol group, a sulfonate group, a phosphate group, a methyl group, a phenyl group, and a mixture or combination thereof.

According to another aspect of the present disclosure, the initiator is further defined to be a photo-radical generator (PRG), a photo-acid generator (PAG), or a mixture or combination thereof. Alternatively, the initiator is p-isopropylphenyl) (p-methylphenyl)iodonium tetrakis(pentafluorophenyl)borate or an amino ketone.

According to another aspect of the present disclosure, a photo-patternable, dielectric coating is applied to a substrate in which the coating comprises the silsequioxane-based resin and the initiator described herein. A portion of the dielectric coating is cured upon exposure to ultraviolet radiation. Another portion of the dielectric coating is left uncured. The uncured portion is soluble in an aqueous solution of tetramethyl ammonium hydroxide (TMAH). Alternatively, the uncured or un-exposed portion is removed or dissolved by one selected from a fluoride-containing vapor, a fluoride-based wet stripper, and an organic solvent.

When a portion of the coating is cured by irradiation through a photo-mask, an image of the photo-mask is replicated after the uncured portion of the coating is removed upon exposure to the aqueous TMAH solution. The dielectric coating exhibits a dielectric constant that is less than or equal to about 3.5.

According to another aspect of the present disclosure, a SSQ-based resin is provided that comprises a T(H) component and at least one photo-curable component, T(R″), selected from the group of T(CHEp), T(EP), and T(MA) components, according to the formula: —(HSiO$_{3/2}$)$_{a0}$—(R$^1$SiO$_{3/2}$)$_{a1}$—(R$^2$SiO$_{3/2}$)$_{a2}$—(R$^3$SiO$_{3/2}$)$_{a3}$— . . . —(R″SiO$_{3/2}$)$_{an}$, (also can be expressed as T(H)$_{a0}$T(R$^1$)$_{a1}$T(R$^2$)$_{a2}$T(R$^3$)$_{a3}$ . . . T(R″)$_{an}$), where T(H) represents the hydrolysis products of a hydrolysable silane, such as trichlorosilane or trimethoxysilane, and where n may be any positive integer. In particular, n is less than or equal to five. The subscripts a0-an represent the mole fraction of the component present in the SSQ-based resin, with the sum of all subscripts (a0+a1+a2+ . . . +an) being equal to 1. The subscript a0 may range between about 0.4 to about 0.9, the subscript a1 is a positive number ranging between about 0.1 to about 0.6, and the subscripts a2 through an may range between 0.0 to about 0.4, provided, however, that the sum of subscripts (a1+a2+a3+ . . . +an) is within the range between about 0.1 to about 0.6.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 1 is a graphical representation of a Si-29 NMR spectrum measured for a silsesquioxane-based resin prepared according to one aspect of the present disclosure.

DETAILED DESCRIPTION

The following description is merely exemplary in nature and is in no way intended to limit the present disclosure or its application or uses. It should be understood that throughout the description and drawings, corresponding reference numerals indicate like or corresponding parts and features.

The present disclosure generally provides silicone-hydride based silsesquioxane (SSQ) resins that contain a photo-curable group. The SSQ-based resin, formulated according to the teachings of the present disclosure along with a photo-initiator, can be applied to a substrate using conventional coating techniques, including but not limited to, spin-coating and spray coating. Upon photo-irradiation through a photomask, the exposed area of the applied SSQ-based coating is cured rapidly; whereas the unexposed area remains uncured and soluble in aqueous tetramethyl ammonium hydroxide (TMAH) solution. After exposure to TMAH, sometimes referred to as "developing" the coating, the desired SSQ-based coating having a predetermined pattern is created.

According to one aspect of the present disclosure, the SSQ-based resin possesses many of the ideal properties expected for a dielectric material used in electronic device fabrication, such as low dielectric constant, high light transmittance, and great thermal stability. The SSQ-based resin can be used in areas where these properties are required or desired, such as in a passivation layer or as a dielectric layer used in electronic display applications. The SSQ-based resin generally comprises both a photo-definable and developable dielectric material that can be used during the fabrication of electronic devices.

The silsesquioxane-based resin contains at least one photo-curable component, defined by —(R$^1$SiO$_{3/2}$)— groups, and another hydride component, described by —(HSiO$_{3/2}$)— groups. The R$^1$ moiety is an organic photo-curable group. For example, the R$^1$ moiety is an epoxy, an acrylate, a vinylether group, or a mixture or combination thereof. In particular, the photo-curable component is T(CHEp), where CHEp is an epoxycyclohexylethyl group, shown below; T(Ep), where Ep is a glycidoxypropyl group, shown below; or T(MA), where MA is a methacryloxypropyl group, shown below.

Alternatively, the SSQ-based resin may contain other auxiliary siloxane components, such as an organo-siloxane component defined by —(R$^2$SiO$_{3/2}$)— groups. The R$^2$ moiety is an organic group. Several examples of an organic group are a polyethylene glycol group, a sulfonate group, a phosphate group, a methyl group, and a phenyl group, among others. The SSQ-based resin may further comprise one or more organo-siloxane components in addition to T(R$^2$), which would be denoted as T(R$^3$), T(R$^4$), . . . and T(R″), where R$^3$, R$^4$, . . . , and R″ are independently selected as an organic group that may be a polyethylene glycol group, a sulfonate group, a phosphate group, a methyl group, a phenyl group, and a mixture or combination thereof.

According to another aspect of the present disclosure, a SSQ-based resin is provided that comprises a T(H) component and at least one photo-curable component, T(R″), selected from the group of T(CHEp), T(EP), and T(MA) components, according to the formula: —(HSiO$_{3/2}$)$_{a0}$—(R$^1$SiO$_{3/2}$)$_{a1}$—(R$^2$SiO$_{3/2}$)$_{a2}$—(R$^3$SiO$_{3/2}$)$_{a3}$— . . . —(R″SiO$_{3/2}$)$_{an}$, (also can be expressed as T(H)$_{a0}$T(R$^1$)$_{a1}$T(R$^2$)$_{a2}$T(R$^3$)$_{a3}$ . . . T(R″)$_{an}$), where T(H) represents the hydrolysis products of a hydrolysable silane, such as trichlorosilane or trimethoxysilane, and where n may be any integer. In particular, n is less than or equal to five. The subscripts a0-an represent the mole fraction of the component present in the SSQ-based resin, with the sum of all subscripts (a0+a1+ a2+ . . . +an) being equal to 1. The subscript a0 may range between about 0.4 to about 0.9, the subscript a1 is a positive number ranging between about 0.1 to about 0.6, and the subscripts a2 through an may range between 0.0 to about 0.4, provided, however, that the sum of subscripts (a1+a2+ a3+ . . . +an) is within the range between about 0.1 to about 0.6.

group. Similarly, the T(CHEp) component is the hydrolysis product of (CHEp)Si(OMe)$_3$, where CHEp is an epoxycyclohexylethyl group; and the T(Ep) component is the hydrolysis product of (Ep)Si(OMe)$_3$, where Ep is a glycidoxypropyl group. A component may also comprise methacryloxypropyl groups (MA). Finally, the component T(H) is the hydrolysis products of trichlorosilane, trimethoxysilane, or the like.

TABLE 1

| Run # | Composition (mole fraction) | Solvent | Photo-initiator | Cure condition | Thickness (Angstroms) | Standard Deviation | Film Loss (%) |
|---|---|---|---|---|---|---|---|
| 1 | $T(Ph)_{0.07}T(H)_{0.45}T(Me)_{0.36}T(EP)_{0.12}$ | PGMEA | PAG | 150-10J-100 | 2220 (before) 2823 (after) | 5.4 22.9 | 0.85% |
| 2 | $T(H)_{0.55}(MA)_{0.30}T(PEO)_{0.15}$ | i-BuOH | PRG | 120-10J-120 | 2286 (before) 2683 (after) | 58.4 79.4 | 26.54% |
| 3 | $T(H)_{0.75}T(CHEp)_{0.25}$ | PGMEA | PAG | 120-10J-120 | 2128 (before) 2105 (after) | 4.6 5.3 | 0.38% |
| 4 | $T(H)_{0.6}T(CHEp)_{0.3}T(PEO)_{0.1}$ | PGBE | PAG | 120-5J-120 | 1798 (before) 1808 (after) | 6.2 2.4 | 0.77% |
| 5 | $T(H)_{0.85}T(CHEp)_{0.15}$ | PGMEA | PAG | 120-10J-120 | 4532 (before) 4297 (after) | 46.2 8 | 0.61% |

The SSQ-based resin when applied as a SSQ-based coating is cured photo-chemically in the presence of at least one of a free-radical initiator, a cationic initiator, or combination or mixture thereof. If the SSQ-based resin after being applied as a coating is irradiated through a photo mask, a photo-image of the mask is replicated after the uncured or unexposed SSQ-based coating is removed by exposure to an aqueous solution of TMAH. The silsesquioxane-based coating after patterning exhibits excellent thermal stability and a low dielectric constant ($k \leq 3.5$).

Alternatively, the uncured or un-exposed SSQ-based coating can be developed by chemical vapors, such as HF vapor, and other fluoride-containing vapors. The uncured or un-exposed SSQ-based coating may also be developed by commercial fluoride-based wet stripper, such as ACT® NE-89 (Air Products & Chemicals, Inc., Allentown, Pa., USA). The uncured or un-exposed SSQ-based coating may also be developed by organic solvents, such as propylene glycol methyl ether acetate (PGMEA), when desirable.

The following specific examples are given to illustrate the invention and should not be construed to limit the scope of the invention.

EXAMPLE 1

Performance Evaluation of SSQ-Based Resins

Several SSQ-based resins (Run #'s 1-5) were prepared according to the description provided below in Examples 2-6. A description of each SSQ-based resin formulation in Run #'s 1-5, the parameters associated with applying and curing the resin to form a SSQ-based coating, and the photocurable properties of the formed coating are provided in Table 1. The short-hand nomenclature used to describe each of the components present in the SSQ-based resin includes the use of the following specific abbreviations. The component described as T(PEO) represents the hydrolysis product of (PEO)SiX$_3$, where PEO is polyethylene oxide and X is a hydrolysable moiety, such as a chloride group, a methoxy group, or other similar group. The hydrolysis products of PhSi(OMe)$_3$ and MeSi(OMe)$_3$ are —(PhSiO$_{3/2}$)— and -(MeSiO$_{3/2}$)—, represented by T(Ph) and T(Me) components, respectively, where Ph stands for a phenyl group and Me stands for a methyl Each of the SSQ-based resins in Run #1-5 includes various ratios of at least one of T(EP), (MA), and T(CHEp) components, along with a predetermined amount of a T(H) component. Alternatively, at least one of T(Ph), T(Me), and T(PEO) components may also be present in the formulation. For example, the resin formed in Run #1 is described as having four components according to the following formula: $T(Ph)_{0.07}T(H)_{0.45}T(Me)_{0.36}T(EP)_{0.12}$. The subscripts of 0.07, 0.45, 0.36, and 0.12 used in conjunction with the T(Ph), T(H), T(Me), and T(EP) components in this example, respectively, indicate the mole fraction of that component present in the overall SSQ-based resin. The amount of the T(H) component present in the formulation may range from about 0.40 to about 0.90 mole fraction. The amount of the T(EP), (MA), and T(CHEp) components in the formulation may range from 0.00 to about 0.40 mole fraction with any remainder being occupied by T(Ph), T(PEO), and T(Me) components, among others.

The ratio of the various components in the SSQ-resin can be determined through the use of Si-29 nuclear magnetic resonance (NMR) or any other technique that is known to one skilled in the art. For example, in FIG. 1, an NMR spectrum obtained for a SSQ-based resin comprising T(H) and T(CHEp) groups is shown in which the ratio of about 26:74 for T(H):T(CHEp) is determined from comparison of the area of the peaks corresponding to each component.

Depending on the resin formulation, a predetermined amount of a photo-initiator, such as a photo-radical generator (PRG), a photo-acid generator (PAG), or a combination or mixture thereof, can be added and mixed with the SSQ-based resin when it is dispersed or dissolved in a solvent to form a resin solution. Several examples of solvents that may be utilized include iso-butanol (i-BuOH), propylene glycol 1-monobutyl ether (PGBE), and propylene glycol methyl ethyl acetate (PGMEA), among others. The amount of the photo-initiator added to the resin solution may be within the range of about 0.5 wt. % to about 3.5 wt. % of the resin solution. Alternatively, the amount of PAG photoinitiator is about 0.85 wt. %, while the amount of PRG initiator is on the order of about 3 wt. %. One specific example of a PAG and PRG solvent is p-isopropylphenyl)(p-methylphenyl)iodonium tetrakis(pentafluorophenyl)borate and an amino ketone (i.e., Irgacure® 379 available from Ciba Special Chemicals, Switzerland), respectively.

According to one aspect of the present disclosure, the amount of SSQ-based resin dispersed or dissolved in a solvent to form a resin solution is about 10 wt. % or more (Run #'s 1-4). Alternatively, the weight percentage of the SSQ-based resin in the solvent may be about 20 wt. % or less (Run #5). After the photo-initiator is added to the resin solution to form a coatable resin solution, the coatable resin solution can be used to form a film or coating on a substrate, such as a wafer, by spin coating, spray coating, or any other technique known to one skilled in the art. One example of a spin coating apparatus is a CT62 spin coater (Karl Suss, Germany). When desirable, the coatable resin solution may be filtered through a 0.2 micron Teflon® polytetrafluoroethylene (PTFE) filter prior to being applied to the substrate as a coating.

In Run #'s 1-5 the coatable resin solutions were coated over a 20 second time period onto standard single-sided four inch polished low resistively wafers or double-sided polished FTIR (Fourier Transform Infrared Spectroscopy) wafers using a spin coater and an initial speed of 2000 rpm with an acceleration speed of 5000 rpm. The substrate may be prebaked at about 120° C. for about 60 seconds or more, followed by exposure to broadband UV irradiation (the UV dosage for Run #'s 1-5 are shown in Table 1 in $J/m^2$). The wafer after application of the coating may also be post-baked at 120° C. for about 60 seconds in order to affect cure. Afterwards, the cured wafer is immersed into an aqueous solution, e.g., aqueous TMAH solution (0.24 N), for 60 seconds. As described in Table 1, a cure condition of 120-10 J-120 (Run #'s 2, 3, & 5) refers to exposing the SSQ-based coating to a pre-bake temperature of 120° C., a UV dosage of 10 $J/m^2$, and a post-bake temperature of 120° C.

The thickness of the applied coating or film that is lost upon exposure to the aqueous TMAH solution after photo-cure is determined by measuring the film thickness before and after immersion of the cured wafer in the TMAH solution using an ellipsometer (J. A. Woollam Co., Lincoln, Nebr., USA). The thickness values that are measured and recorded may comprise a single measurement or when desired an average of multiple measurements, i.e., nine measurements.

Still referring to Table 1, the coatings or films prepared using the SSQ-based resins of the present disclosure exhibit a film loss upon exposure to an aqueous solution of TMAH within the range of about 0.25% to about 26.5%. The coating (Run #2) prepared using a SSQ-based resin comprising methacryloxypropyl group—(MA) as one of its components exhibits the greatest amount of film loss upon exposure to an aqueous solution of tetramethyl ammonium hydroxide (TMAH). The coatings (Run #'s 1, 3-5) that did not include MA as a component exhibit a substantially smaller film loss. Alternatively, the coatings exhibit a film loss upon exposure to an aqueous solution of TMAH less than about 1%.

The SSQ-based coatings or films prepared according to the teachings of the present disclosure exhibit great thermal stability throughout the cure process. For example, as described in Table 2, the SSQ-based coating obtained from the SSQ-resin of Run #5 was evaluated using thermal gravimetric analysis (TGA) under an inert nitrogen atmosphere and a temperature ramp rate of 10° C./minute. A difference in the weight of this SSQ-based coating after exposure to cure conditions of 120-10-120 in the presence of 0.86 wt. % of a photoacid generator (PAG) is 2.2%.

TABLE 2

| | Temperature (° C.) | | | | |
|---|---|---|---|---|---|
| | 50 | 100 | 200 | 300 | 400 |
| Weight (%) Remaining | 100.0 | 101.0 | 102.0 | 101.0 | 98.8 |

The SSQ-based resin prepared having the composition of $T(H)_{0.85}T(CHEp)_{0.15}$ in Run #5 was used to cast several films having different thickness (Run #'s 6 & 7). The mechanical, optical, chemical, and electrical properties of these films can be tested by any techniques known in the art. Examples of different basic film properties include, but are not limited to, hardness, modulus, stress, breakdown voltage, reflective index, dielectric constant, film shrinkage, and transmittance as shown in Table 3 for Run #'s 6 & 7. One of the films (Run #6) exhibited a thickness that was about $\frac{1}{3}^{rd}$ the thickness of the other film (Run #7). All of the properties associated with the films remained relatively constant, except for the breakdown voltage and film shrinkage. The film (Run #6), which was thinner in thickness than the other film (Run #7) exhibited a higher breakdown voltage and percentage of film shrinkage. The photo-cured and developed SSQ-based coating of the present disclosure exhibits a dielectric constant about 3.0.

TABLE 3

| Run # | Thickness (Angstroms) | Hardness (Gpa) | Modulus (Gpa) | Stress (MPa) | Breakdown voltage (mV/cm) | Reflective index | Dielectric constant (K) | Film shrinkage (%) | Transmittance (%) |
|---|---|---|---|---|---|---|---|---|---|
| 6 | 6600 | 0.14 | 3.2 | 15.7 | 5.7 | 1.44 | 2.99 | 5.5% | ~98 |
| 7 | 18000 | 0.19 | 3.0 | 21.7 | 2.4 | 1.45 | 3.01 | 5.0% | ~98 |

EXAMPLE 2

Preparation of $T(Ph)_{0.07}T(H)_{0.45}T(Me)_{0.36}T(EP)_{0.12}$ Resin

This example demonstrates the method used to prepare the SSQ-based resin described in Run #1. A total of 500 grams of propylene glycol methyl ethyl acetate (PGMEA), 14.80 grams of $PhSiCl_3$, 53.80 grams of $MeSiCl_3$, and 77.20 grams of $HSiCl_3$ were added together in a three-necked 3-liter flask. A solution of PGMEA (800 g) and water (40 g) was added to the flask over a one-hour period to form a resin solution. The resin solution was allowed to further hydrolyze for one hour at 23° C. The resin solution was then washed with deionized (DI) water three times (3×100 grams) and stripped to a 15 wt % PGMEA solution. A total of 28.35 grams of 3-glycidoxypropyl trimethoxysilane and a few drops of a platinum catalyst were added to this solution. The mixture was stirred for two hours at 50° C. Active charcoal (5 wt. %) was then added to the solution and the mixture continued to be stirred for 2 hours at 50° C., followed by filtration through a 0.2 micron PTFE filter. The filtered solution was diluted with PGMEA to form a 10 wt. % resin solution and stored in a HDPE bottle for future use in forming an SSQ-based coating. The weight average molecular weight ($M_w$) and the polydispersity (PDI) was measured using gel permeation chromatography for the SSQ-based resin (Run #1) to be about 19,500 and 2.97, respectively.

EXAMPLE 3

Preparation of $T(H)_{0.55}(MA)_{0.30}T(PEO)_{0.15}$ Resin

This example demonstrates the method used to prepare the SSQ-based resin described in Run #2. A total of 100 grams of ethyl acetate, 28.84 grams of $PEO-SiCl_3$, 37.25 grams of $(MA)Si(OMe)_3$, and 37.25 grams of $HSiCl_3$ were added together in a three-necked 3-liter flask. A solution of ethyl acetate (300 g) and water (27 g) was added to the flask over a one-hour period to form a resin solution. The resin solution was allowed to further hydrolyze for one hour. The resin solution was then washed with deionized (DI) water and the solvent finally exchanged with iso-butanol using a rotary evaporator. In other words, the solvent in the resin solution was vacuum stripped and i-butanol added to form a resin solution having 10 wt. % of the SSQ-based resin. The resin solution was filtered through a 0.2 micron PTFE filter and stored in a high density polyethylene (HDPE) bottle for future use in forming an SSQ-based coating. The weight average molecular weight ($M_w$) and the polydispersity (PDI) was measured using gel permeation chromatography for the SSQ-based resin (Run #2) to be about 9,530 and 2.02, respectively.

EXAMPLE 4

Preparation of $T(H)_{0.75}T(CHEp)_{0.25}$ Resin

This example demonstrates the method used to prepare the SSQ-based resin described in Run #3. To a 500 mL flask containing a 12.5 wt. % amount of hydrogen silsesquioxane ($M_w$=2200) dispersed or dissolved in toluene and vinyl cyclohexene oxide were added a few drops of a platinum catalyst. The mixture was stirred for two hours at 23° C. Active charcoal (5 wt. %) was then added to the solution and the mixture continued to be stirred for 1 hour at 23° C., followed by filtration. The filtered solution was then subjected to vacuum stripping and the solvent exchanged with PGMEA to form a 10 wt. % resin solution. The resin solution was filtered through a 0.2 micron PTFE filter and stored in a HDPE bottle for future use in forming an SSQ-based coating. The weight average molecular weight ($M_w$) and the polydispersity (PDI) was measured using gel permeation chromatography for the SSQ-based resin (Run #3) to be about 8,900 and 4.06, respectively.

EXAMPLE 5

Preparation of $T(H)_{0.6}T(CHEp)_{0.3}T(PEO)_{0.10}$ Resin

This example demonstrates the method used to prepare the SSQ-based resin described in Run #4. Similar to the method of Example 4, a few drops of a platinum catalyst was added to a 500 mL flask containing hydrogen silsesquioxane in toluene (Mw=2,200, 12.5 wt. % in toluene), allyl mono-methyl polyethylene glycol, and vinyl cyclohexene oxide. The mixture was stirred for two hours at 80° C. Next, active charcoal (5 wt. %) was added to the solution and the mixture was stirred for an additional 1 hour at 23° C., followed by filtration. The filtered solution was then subjected to vacuum stripping and the solvent exchanged with propylene glycol 1-monobutyl ether (PGBE) to form a 10 wt. % resin solution. The resin solution was filtered through a 0.2 micron PTFE filter and stored in a HDPE bottle for future use in forming an SSQ-based coating. The weight average molecular weight ($M_w$) and the polydispersity (PDI) was measured using gel permeation chromatography for the SSQ-based resin (Run #4) to be about 4,360 and 3.04, respectively.

EXAMPLE 6

Preparation of $T(H)_{0.85}T(CHEp)_{0.15}$ Resin

This example demonstrates the method used to prepare the SSQ-based resin described in Run #5. Similar to the methods of Example 4 & 5, a few drops of a platinum catalyst was added to a 500 mL flask containing hydrogen silsesquioxane in toluene (153.2 g, Mw=2200, 12.5% wt in toluene) and vinyl cyclohexene oxide (9.31 g). The mixture was stirred for two hours at 23° C. Next, active charcoal (5 wt. %) was added to the resin solution and the mixture was allowed to stir for an additional 1 hour at 23° C., followed by filtration. The filtered solution was then subjected to vacuum stripping and the solvent exchanged with PGMEA to form a 20% weight resin solution. The solution was filtered through a 0.2 micron PTFE filter and stored in a HDPE bottle for future use in forming an SSQ-based coating. The weight average molecular weight ($M_w$) and the polydispersity (PDI) was measured using gel permeation chromatography for the SSQ-based resin (Run #5) to be about 6,950 and 4.43, respectively.

A person skilled in the art will recognize that the measurements described are standard measurements that can be obtained by a variety of different test methods. The test methods described in the examples represents only one available method to obtain each of the required measurements.

The foregoing description of various embodiments of the present disclosure has been presented for purposes of illustration and description. It is not intended to be exhaustive or to limit the present disclosure to the precise embodiments disclosed. Numerous modifications or variations are possible in light of the above teachings. The embodiments discussed were chosen and described to provide the best illustration of the principles included in the present disclosure and its practical application to thereby enable one of ordinary skill in the art to utilize the teachings of the present disclosure in various embodiments and with various modifications as are suited to the particular use contemplated. All such modifications and variations are within the scope of the present disclosure as determined by the appended claims when interpreted in accordance with the breadth to which they are fairly, legally, and equitably entitled.

What is claimed is:

1. A coatable resin solution for forming a coating on a substrate, such as a wafer or electronic device, the resin solution comprising:

a silsequioxane-based resin comprising a hydride component present in a mole fraction between 0.40 to 0.90 and at least one photo-curable component up to a mole fraction of 0.40 for the photo-curable component, the hydride component characterized by units of —$(HSiO_{3/2})$—; the photo-curable component characterized by units of —$(R^1SiO_{3/2})$—, where $R^1$ is an organic photocurable group;

at least one initiator selected as one from the group of a free-radical initiator, a cationic initiator, and a combination or mixture thereof; and an organic solvent;

wherein the resin solution is capable of forming a coating when applied to the surface of a substrate that is photo-patternable and developable as a dielectric material upon exposure to ultraviolet radiation;

wherein the silsesquioxane-based resin does not further comprise an organo-siloxane component characterized by units of —($R^2SiO_{3/2}$)—, where $R^2$ is an organic group.

2. The resin solution of claim 1, wherein $R^1$ is selected as one from the group of an epoxy group, an acrylate group, a vinylether group, a vinyl group, and a mixture or combination thereof.

3. The resin solution of claim 2, wherein $R^1$ is an epoxy-cyclohexylethyl group, a glycidoxypropyl group, or a methacryloxypropyl group.

4. The resin solution of claim 1, wherein the initiator is one selected from the group of a photo-radical generator (PRG), a photo-acid generator (PAG), and a mixture or combination thereof.

5. The resin solution of claim 4, wherein the initiator is one selected from the group of p-isopropylphenyl)(p-methylphenyl)iodonium tetrakis(pentafluoro-phenyl)borate and an amino ketone.

6. The resin solution of claim 1, wherein the organic solvent is one selected from the group of iso-butanol (i-BuOH), propylene glycol 1-monobutyl ether (PGBE), and propylene glycol methyl ethyl acetate (PGMEA).

7. The resin solution of claim 1, wherein the weight percentage of the silsesquioxane resin in the solution is about 10 wt. % or more.

8. The resin solution of claim 1, wherein the weight percentage of the initiator in the resin solution is within the range of about 0.5 wt. % to about 3.5 wt. %.

9. A coatable resin solution for forming a coating on a substrate, such as a wafer or electronic device, the resin solution comprising:

a silsesquioxane-based resin comprising a hydride component present in a mole fraction between 0.40 to 0.90 and at least one photo-curable component up to a mole fraction of 0.40 for the photo-curable component, the hydride component characterized by units of —($HSiO_{3/2}$)—; the photo-curable component characterized by units of —($R^1SiO_{3/2}$)—, where $R^1$ is an organic photocurable group;

at least one initiator selected as one from the group of a free-radical initiator, a cationic initiator, and a combination or mixture thereof; and an organic solvent;

wherein the resin solution is capable of forming a coating when applied to the surface of a substrate that is photo-patternable and developable as a dielectric material upon exposure to ultraviolet radiation;

wherein the silsesquioxane-based resin further comprises an organo-siloxane component, the organo-siloxane component being characterized by units of —($R^2SiO_{3/2}$)—, where $R^2$ is a polyethylene glycol group.

* * * * *